(12) United States Patent
Chang et al.

(10) Patent No.: US 10,437,298 B2
(45) Date of Patent: Oct. 8, 2019

(54) LIFTING MECHANISM AND ELECTRONIC DEVICE

(71) Applicants: Yen-Chia Chang, Taipei (TW); Shih-Wei Wang, Taipei (TW)

(72) Inventors: Yen-Chia Chang, Taipei (TW); Shih-Wei Wang, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 0 days.

(21) Appl. No.: 15/986,843

(22) Filed: May 23, 2018

(65) Prior Publication Data
US 2019/0101963 A1 Apr. 4, 2019

Related U.S. Application Data

(60) Provisional application No. 62/566,545, filed on Oct. 2, 2017.

(51) Int. Cl.
| | |
|---|---|
| G06F 1/20 | (2006.01) |
| H05K 7/20 | (2006.01) |
| G11B 33/14 | (2006.01) |
| H05K 5/00 | (2006.01) |
| H05K 7/14 | (2006.01) |

(52) U.S. Cl.
CPC .......... *G06F 1/20* (2013.01); *G11B 33/1413* (2013.01); *H05K 5/0073* (2013.01); *H05K 7/2049* (2013.01); *H05K 7/20336* (2013.01); *H05K 7/20445* (2013.01); *H05K 7/20509* (2013.01);
(Continued)

(58) Field of Classification Search
CPC .. H05K 7/1402; H05K 7/1409; H05K 7/1418; H05K 7/20563–20572; H05K 7/20636–20645; H05K 7/20672–20681; H05K 7/20727–20736; H05K 7/20772–20781; H05K 7/20809–20818; G11B 33/142
See application file for complete search history.

(56) References Cited

U.S. PATENT DOCUMENTS

| | | | |
|---|---|---|---|
| 6,393,853 B1 * | 5/2002 | Vukovic | H01L 23/473 |
| | | | 165/80.4 |
| 6,611,424 B2 * | 8/2003 | Huang | G11B 33/128 |
| | | | 248/224.51 |

(Continued)

FOREIGN PATENT DOCUMENTS

| | | |
|---|---|---|
| TW | 556873 | 10/2003 |
| TW | I220942 | 9/2004 |
| TW | M326661 | 2/2008 |

*Primary Examiner* — Robert J Hoffberg
(74) *Attorney, Agent, or Firm* — JCIPRNET

(57) ABSTRACT

A lifting mechanism is adapted to bear an expansion unit, and the expansion unit contacts or is separated from a heat dissipating module. The lifting mechanism includes an outer casing base and a bearing base. The bearing base is disposed on the outer casing base liftably along a first axis. The expansion unit is disposed on the bearing base. When the bearing base is located at an original position relative to the outer casing base, the expansion unit on the bearing base is separated from the heat dissipating module. When the bearing base is lifted relative to the outer casing base along the first axis to a lifting position, the expansion unit on the bearing base contacts the heat dissipating module. An electronic device having the lifting mechanism is further provided.

15 Claims, 17 Drawing Sheets

(52) U.S. Cl.
CPC ....... *H05K 7/1415* (2013.01); *H05K 7/20809* (2013.01)

(56) References Cited

U.S. PATENT DOCUMENTS

| | | | | |
|---|---|---|---|---|
| 6,721,177 B1* | 4/2004 | Wang | ................... | G11B 33/128 248/638 |
| 6,882,533 B2* | 4/2005 | Bash | ................... | H05K 7/20636 165/185 |
| 7,133,285 B2* | 11/2006 | Nishimura | ........... | H05K 5/0265 361/715 |
| 7,518,870 B2* | 4/2009 | Choi | ................... | H05K 5/0265 361/702 |
| 7,525,795 B2* | 4/2009 | Cheng | ................... | G06F 1/184 248/27.1 |
| 7,667,972 B2* | 2/2010 | Chen | ................... | G06K 7/0047 165/104.33 |
| 7,852,633 B2* | 12/2010 | Ito | ................... | H05K 5/0286 165/80.3 |
| 8,427,823 B2* | 4/2013 | Yamada | ............... | G11B 33/128 312/223.1 |
| 8,670,238 B2* | 3/2014 | Wang | ................... | G02B 6/4261 165/185 |
| 9,565,795 B2* | 2/2017 | Takai | ................... | G02B 6/4277 |

* cited by examiner

LIFTING MECHANISM AND ELECTRONIC DEVICE

CROSS-REFERENCE TO RELATED APPLICATION

This application claims the priority benefits of U.S. provisional application Ser. No. 62/566,545, filed on Oct. 2, 2017. The entirety of the above-mentioned patent applications is hereby incorporated by reference herein and made a part of this specification.

BACKGROUND

Field of the Invention

The invention relates to a lifting mechanism and an electron device and more particularly, to a lifting mechanism adapted to bear an expansion unit and an electron device having the lifting mechanism.

Description of Related Art

As users' demands become more and more diverse, some electronic devices are provided with expansion slots for the expansion units to be inserted in. The expansion units in operation generate heat. However, if a heat dissipating module capable of contacting the expansion unit is disposed next to the expansion slot, the expansion unit, during the process of being inserted into the expansion slot, interferes with the heat dissipating module, which may result in difficulty in the insertion, or even cause wear to the expansion unit and the heat dissipating module.

SUMMARY

The invention provides a lifting mechanism capable of bearing an expansion unit for the expansion unit to selectively move between an original position and a lifting position.

The invention provides an electronic device having the lifting mechanism.

A lifting mechanism of the invention is used for bearing an expansion unit for the expansion unit to contact or be separated from a heat dissipating module. The bearing base is disposed on the outer casing base liftably along a first axis. The expansion unit is adapted to be disposed on the bearing base. When the bearing base is located at an original position relative to the outer casing base, the expansion unit on the bearing base is separated from the heat dissipating module. When the bearing base is lifted relative to the outer casing base along the first axis to a lifting position, the expansion unit on the bearing base contacts the heat dissipating module.

An electronic device of the invention includes a frame base, a heat dissipating module, a lifting mechanism and an expansion unit. The heat dissipating module is fixed to the frame base, thereby jointly forming an accommodation space. The lifting mechanism is pluggably disposed in the accommodation space. The lifting mechanism includes an outer casing base and a bearing base. The bearing base is disposed on the outer casing base liftably along a first axis. The expansion unit is disposed on the bearing base. When the lifting mechanism is located in the accommodation space and the bearing base is located at an original position relative to the outer casing base, the expansion unit on the bearing base is separated from the heat dissipating module. When the bearing base is lifted relative to the outer casing base along the first axis to a lifting position, the expansion unit on the bearing base contacts the heat dissipating module.

In an embodiment of the invention, the outer casing base includes a first groove extending along the first axis, the lifting mechanism further includes an inner casing base disposed on the outer casing base movably along a second axis and including a second groove. A part of the second groove extends along the second axis, and the bearing base includes a protrusion pillar passing the second groove and the first groove. The inner casing base is used for moving relative to the outer casing base along the second axis, such that the bearing base is lifted relative to the outer casing base from the original position to the lifting position along the first axis.

In an embodiment of the invention, the frame base includes a side wall and a foolproof groove sunk in the side wall, and the foolproof groove extends along the second axis and communicates with the accommodation space. When the lifting mechanism is located in the accommodation space and the outer casing base faces the frame base, the protrusion pillar of the bearing base extends into the foolproof groove.

In an embodiment of the invention, the second groove includes a first section and a second section connected with each other, the second section extends along the second axis, and the first section is inclined with respect to the second section.

In an embodiment of the invention, the outer casing base includes a first bottom plate, the first bottom plate includes a first positioning portion and a second positioning portion arranged along the second axis, the inner casing base includes a second bottom plate, and the second bottom plate includes a cantilever and a third positioning portion protruding from the cantilever. When the bearing base is located at the original position, the third positioning portion is fixed to the first positioning portion. When the bearing base is located at the lifting position, the third positioning portion is fixed to the second positioning portion.

In an embodiment of the invention, the inner casing base further includes a pull handle exposed from the outer casing base, and a part of the third positioning portion which faces the pull handle includes a bevel or an arc surface.

In an embodiment of the invention, the lifting mechanism further includes a cover body fixed to the bearing base and including an opening, and the expansion unit is adapted to be disposed between the bearing base and the cover body and be exposed from the opening.

In an embodiment of the invention, the lifting mechanism further includes a first connector, a second connector and a flexible circuit board. The first connector is disposed on the outer casing base. The second connector is disposed on the bearing base and adapted to be connected to the expansion unit. The flexible circuit board is located between the outer casing base and the bearing base and is connected to the first connector and the second connector.

In an embodiment of the invention, the electronic device further includes a chassis. The frame base and the heat dissipating module are disposed in the chassis. The chassis includes an opening exposing the accommodation space. The lifting mechanism and the expansion unit passing through the opening of the chassis are pluggably disposed in the accommodation space.

To sum up, the lifting mechanism of the electronic device of the invention, with the bearing base, can be lifted relative to the outer casing base along the first axis. When the lifting mechanism is located in the accommodation space and the bearing base is located at an original position relative to the outer casing base, the expansion unit on the bearing base does not contact the heat dissipating module. When the bearing base is lifted relative to the outer casing base along the first axis to a lifting position, the expansion unit on the bearing base contacts the heat dissipating module. In this way, the lifting mechanism, during the process of entering the accommodation space of the electronic device, can be prevented from interfering with the heat dissipating module.

To make the above features and advantages of the invention more comprehensible, embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
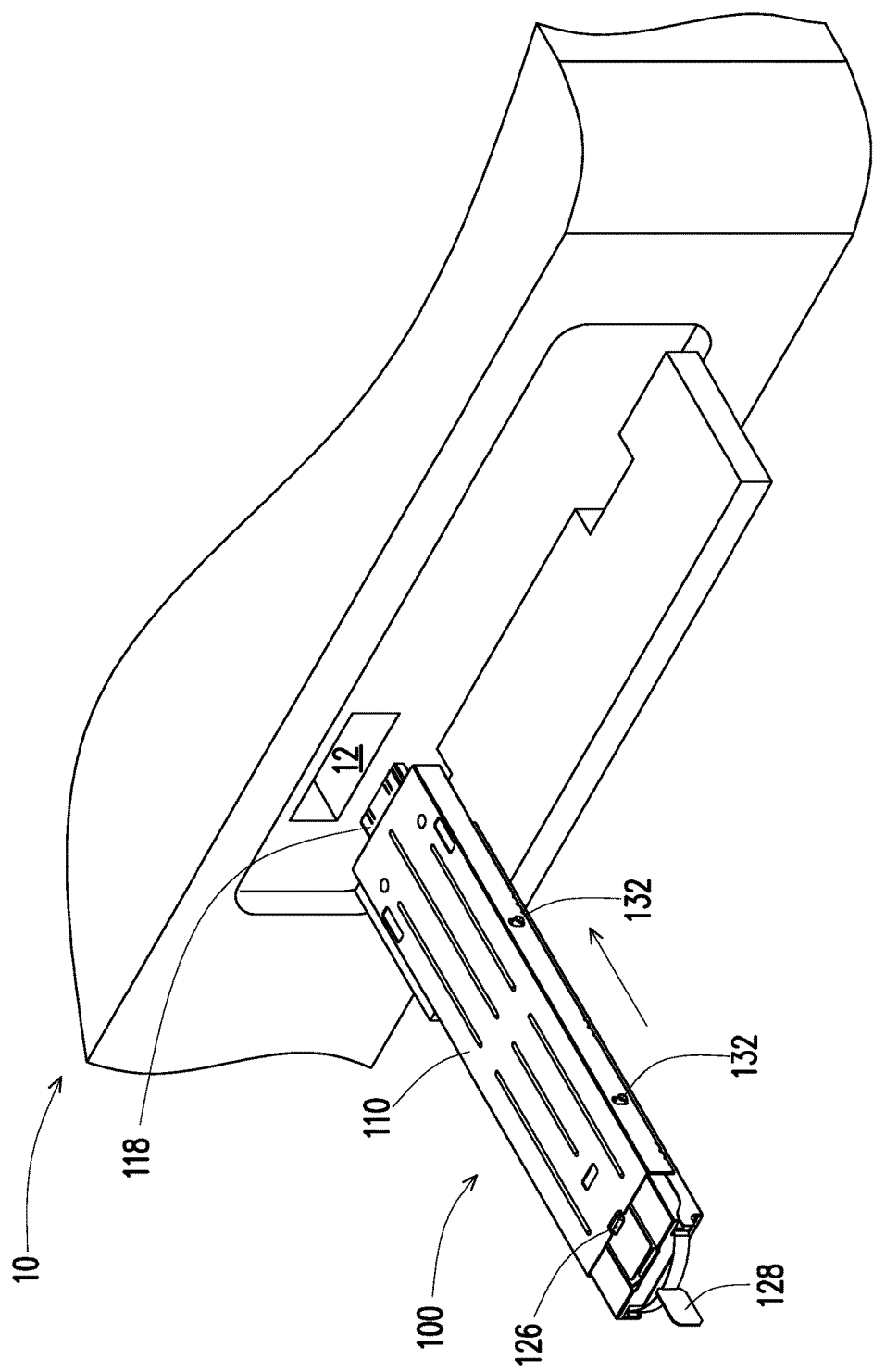
FIG. 1 to FIG. 3 are schematic diagrams illustrating a process of a lifting mechanism being inserted into an electronic device according to an embodiment of the invention.
Figure 2:
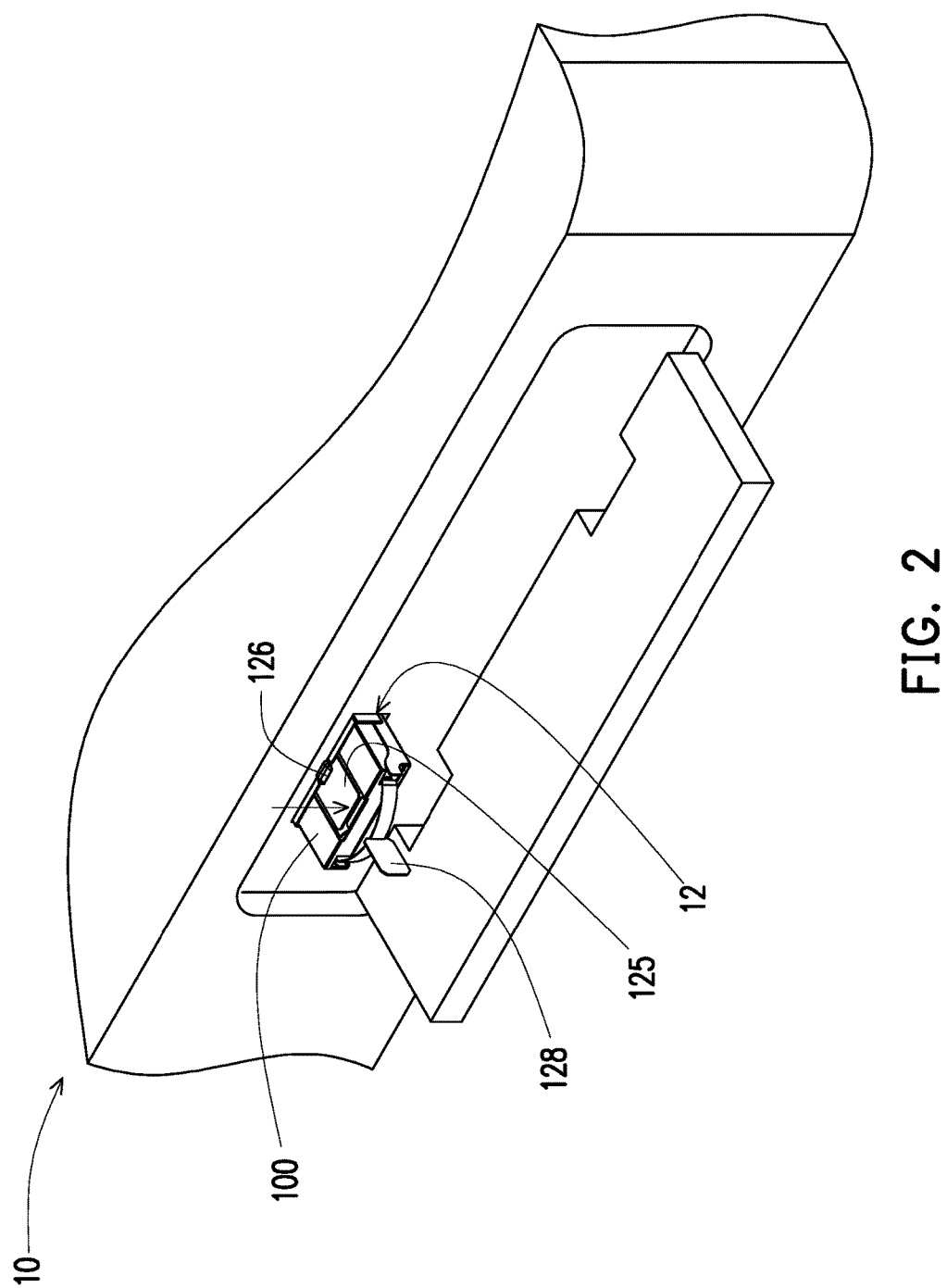
Figure 3:
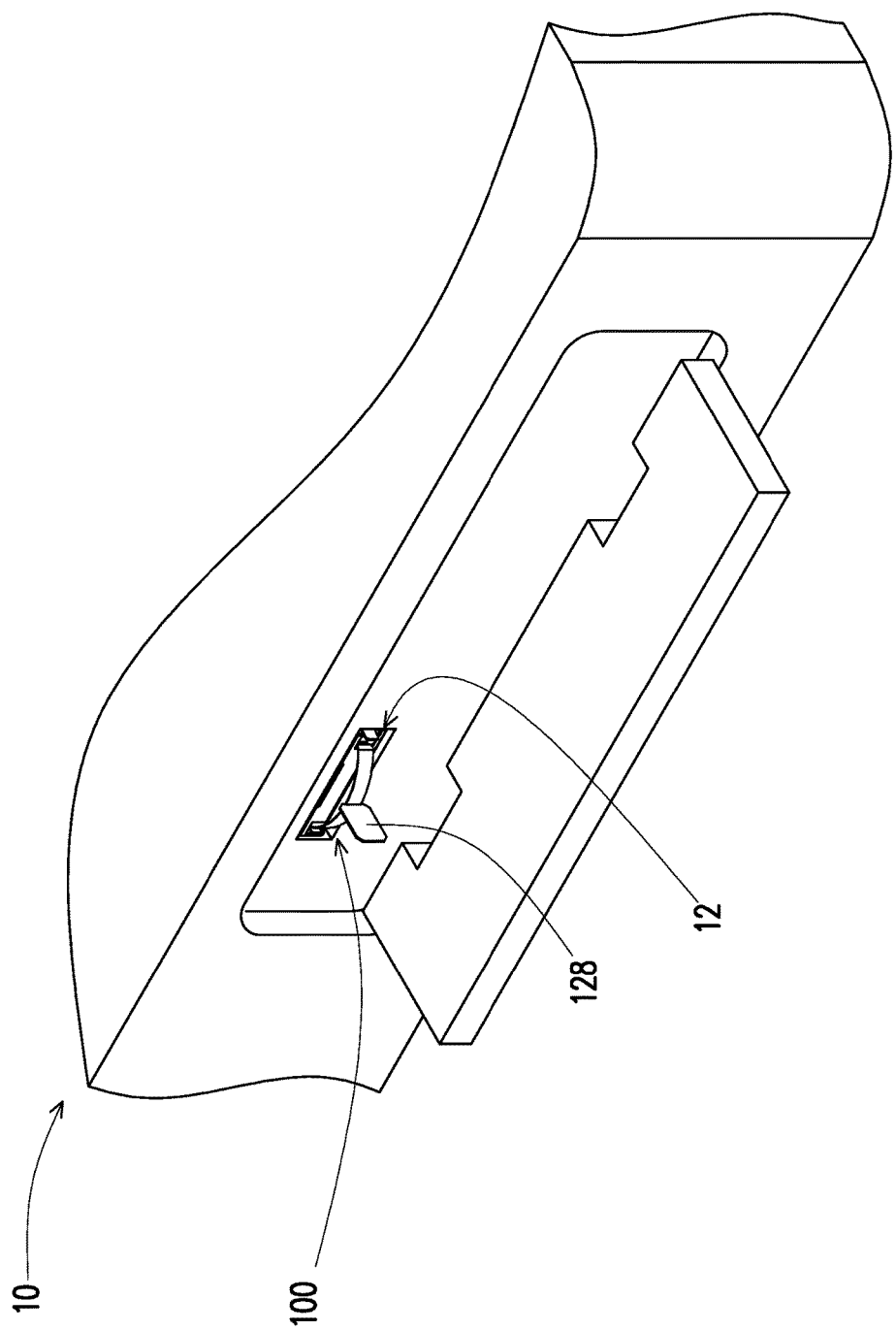
Figure 5:
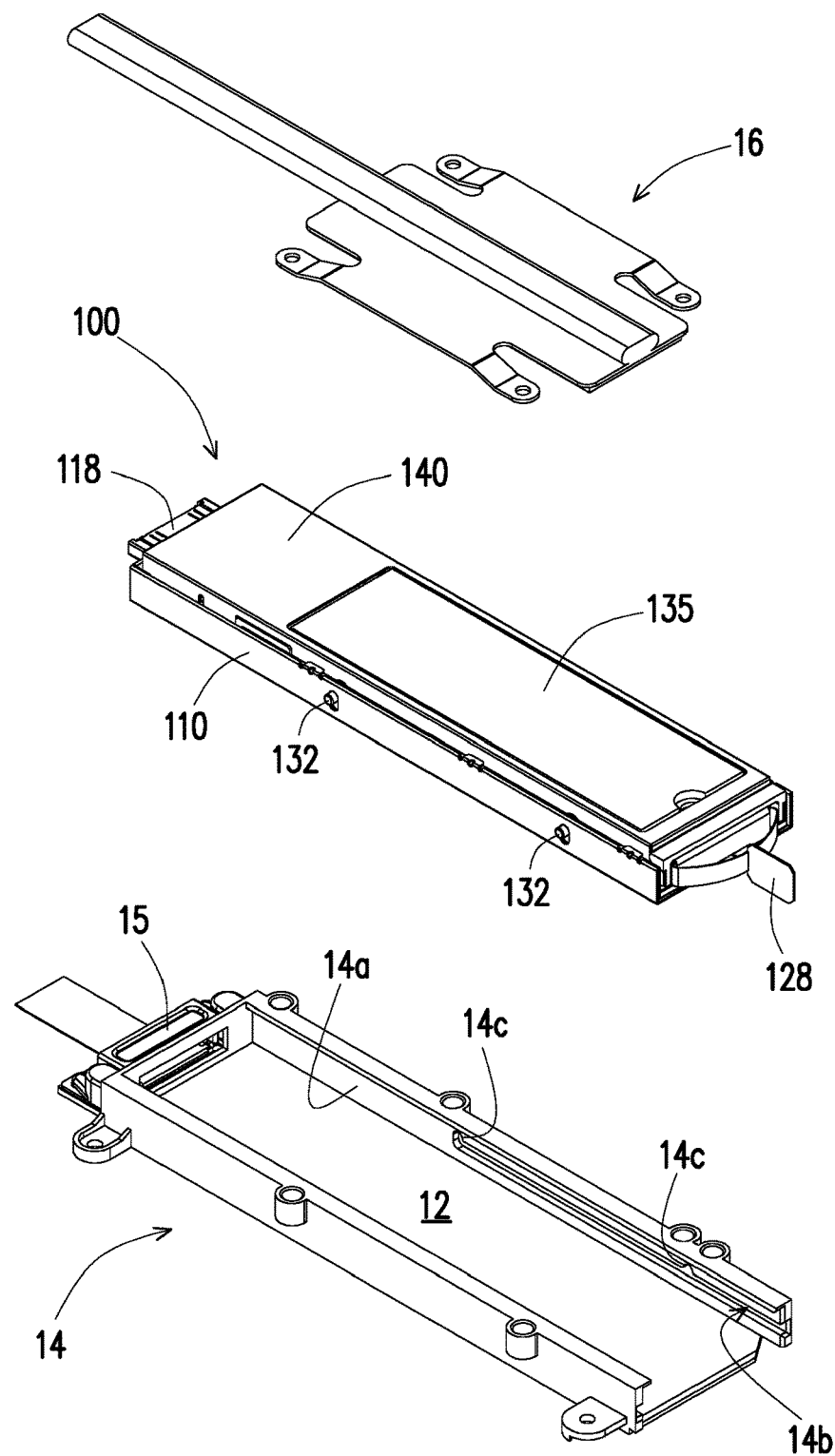
FIG. 5 is a schematic exploded diagram of FIG. 4.
Figure 6:
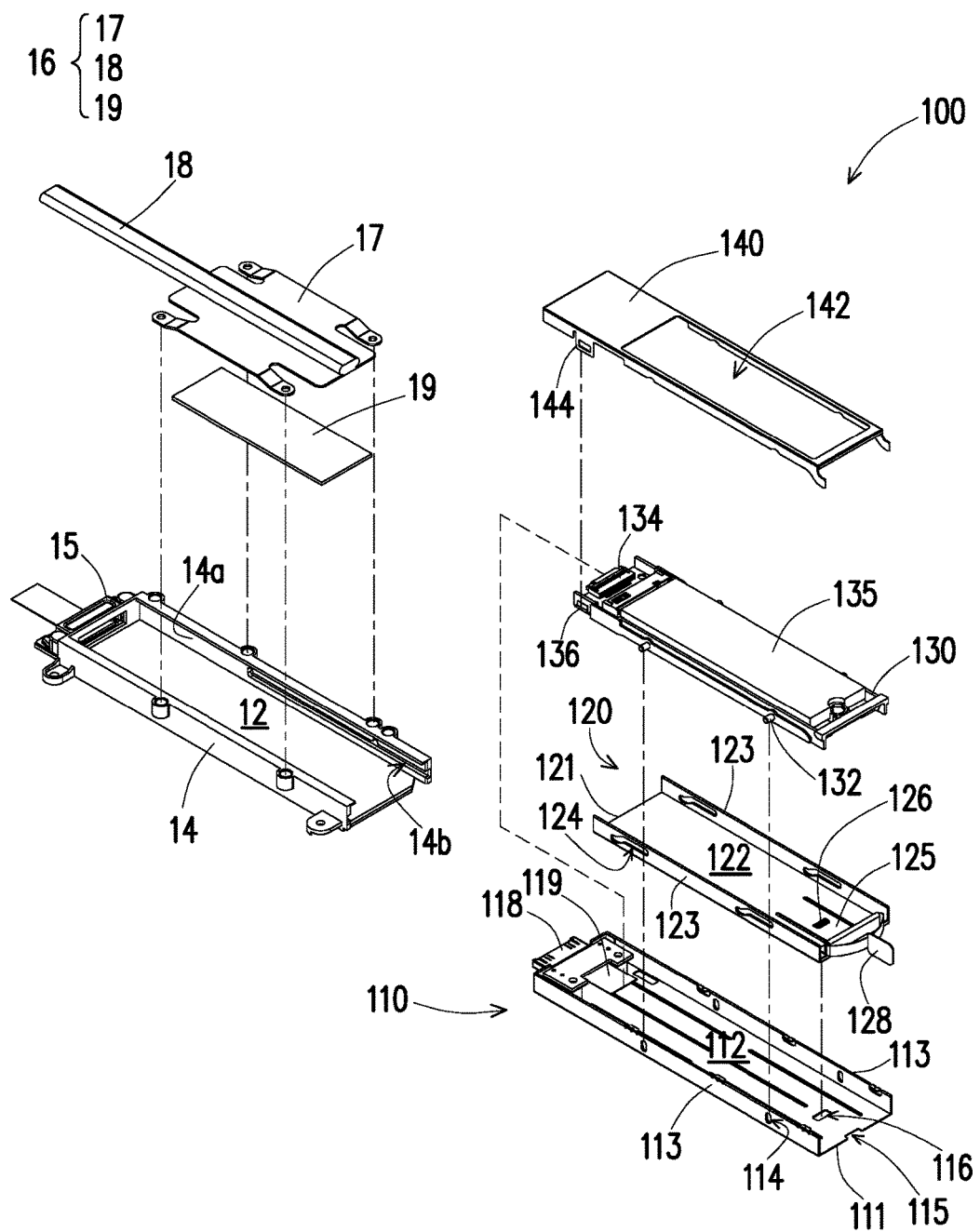
FIG. 6 is a schematic exploded diagram illustrating details of the lifting mechanism, the frame base and the heat dissipating module depicted in FIG. 4.

FIG. 1 to FIG. 3 are schematic diagrams illustrating a process of a lifting mechanism being inserted into an electronic device according to an embodiment of the invention. Referring to FIG. 1 to FIG. 3, an electronic device 10 of the present embodiment is, for example, a computer or a server, but the type of the electronic device 10 is not limited thereto. In the present embodiment, the electronic device 10 includes an accommodation space 12 exposing to the outside for an expansion unit 135 (which is illustrated in FIG. 6) to be inserted in. The expansion unit 135 is, for example, a solid-state drive (SSD), but the type of the expansion unit 135 is not limited thereto. In the present embodiment, as the expansion unit 135 in operation generates heat, a designer may dispose a heat dissipating module 16 (which is illustrated in FIG. 5) near the expansion unit 135 in the electronic device 10 for the expansion unit 135 to be thermally coupled to the heat dissipating module 16.

In the present embodiment, the expansion unit 135 is installed on a lifting mechanism 100 of the present embodiment, such that the expansion unit 135 may be inserted into the accommodation space 12 of the electronic device 10 together with the lifting mechanism 100. During the process from FIG. 1 to FIG. 2, the expansion unit 135 is not yet lifted by the lifting mechanism 100. Thus, during the process of inserting the expansion unit 135 and the lifting mechanism 100 into the accommodation space 12 of the electronic device 10, the expansion unit 135 does not interfere with the heat dissipating module 16, and the expansion unit 135 may be inserted into the accommodation space 12 successfully. In addition, during the process from FIG. 2 to FIG. 3, the expansion unit 135 is lifted by the lifting mechanism 100 to gradually move toward the heat dissipating module 16 and to contact the heat dissipating module 16 in a state as illustrated in FIG. 3. Thus, when the expansion unit 135 is in operation, the heat generated thereby may be transferred to the heat dissipating module 16, thereby preventing the expansion unit 135 from being over-heated. Related elements of the electronic device 10 and the lifting mechanism 100 will be described in detail below.

Figure 4:
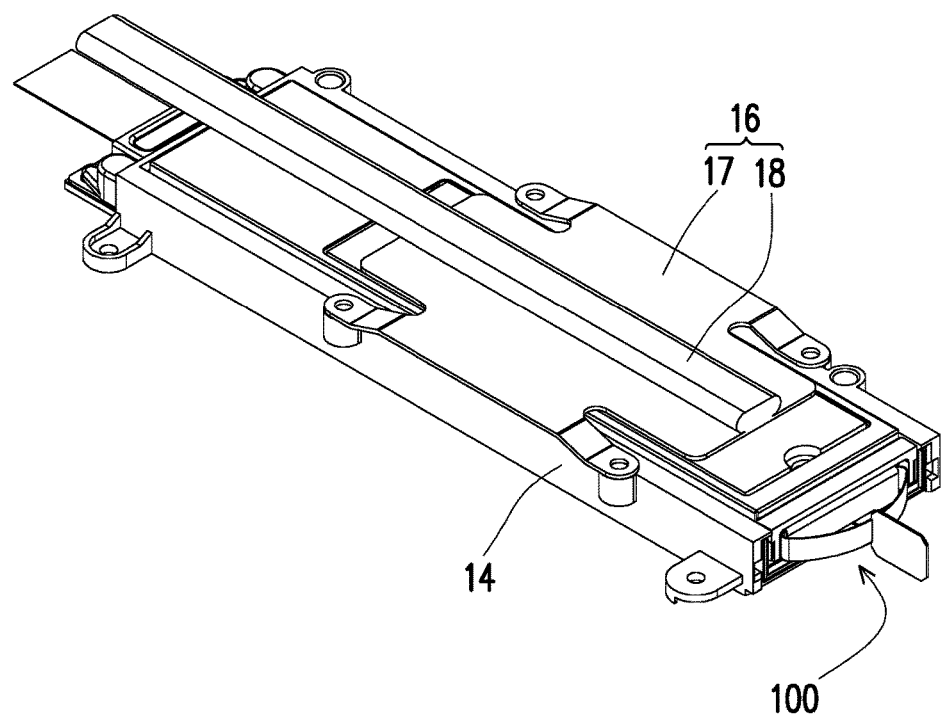
FIG. 4 is a schematic view illustrating that the lifting mechanism depicted in FIG. 1 is located in a frame base and a heat dissipating module.

FIG. 4 is a schematic view illustrating that the lifting mechanism depicted in FIG. 1 is located in a frame base and a heat dissipating module. FIG. 5 is a schematic exploded diagram of FIG. 4. It should be mentioned that the view angles in FIG. 4 and FIG. 5 are vertically opposite to the view angles in FIG. 1 to FIG. 3. In other words, in FIG. 4 and FIG. 5, a frame base 14 of the electronic device 10 is located under the lifting mechanism 100, and the heat dissipating module 16 is located above the lifting mechanism 100. In FIG. 1 to FIG. 3, although the frame base 14 and the heat dissipating module 16 are located inside the electronic device 10 and are not shown, in the view angles of FIG. 1 to FIG. 3, the frame base 14 is located under the lifting mechanism 100, and the heat dissipating module 16 is located under the lifting mechanism 100. Referring to FIG. 4 and FIG. 5, in the present embodiment, the electronic device 10 (which is illustrated in FIG. 1) includes a frame base 14 and a heat dissipating module 16. In the present embodiment, the frame base 14 and the heat dissipating module 16 are disposed in a chassis of the electron device 10, and the heat dissipating module 16 is fixed to the frame base 14, thereby jointly forming the accommodation space 12 (which is illustrated in FIG. 5). According to FIG. 1, the chassis includes an opening exposing the accommodation space 12, and the expansion unit 135 (which is illustrated in FIG. 5) together with the lifting mechanism 100 passing through the opening of the chassis are pluggably disposed in the accommodation space 12. In the present embodiment, the expansion unit 135, during the process of being installed in or detached from the electronic device 10, moves in or out of the accommodation space 12 through the opening of the chassis, without detaching or removing the chassis of the electronic device 10, which brings convenience to the installation and detachment.

Figure 7:
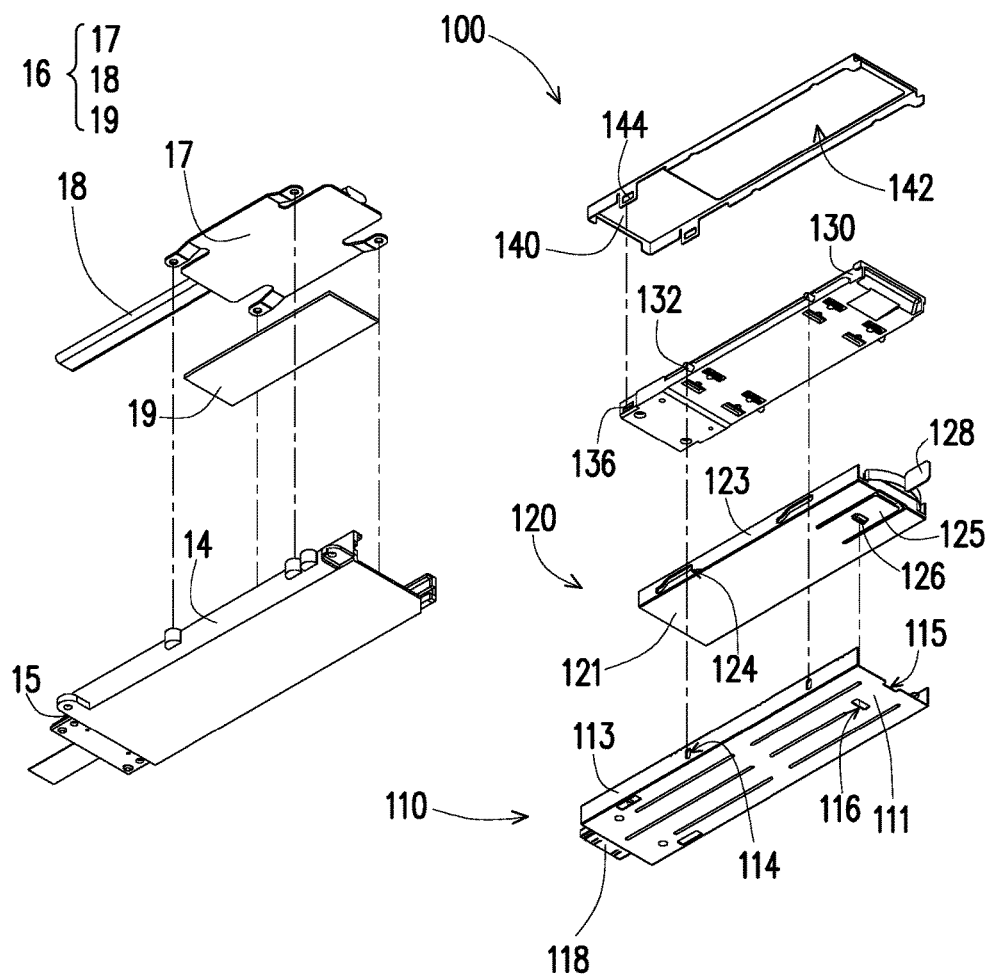
FIG. 7 is a schematic diagram of FIG. 6 from another view angle.

FIG. 6 is a schematic exploded diagram illustrating details of the lifting mechanism, the frame base and the heat dissipating module depicted in FIG. 4. FIG. 7 is a schematic diagram of FIG. 6 from another view angle. It should be mentioned that in FIG. 6 and FIG. 7, the lifting mechanism 100 and the heat dissipating module 16 illustrated in FIG. 15 are presented by means of exploded views, thereby the internal structures of the lifting mechanism 100 and the heat dissipating module 16 are illustrated more clearly.

Referring to FIG. 6 to FIG. 7 simultaneously, in the present embodiment, the lifting mechanism 100 includes an outer casing base 110, an inner casing base 120, a bearing base 130 and a cover body 140. The outer casing base 110 includes a first groove 114 extending along a first axis A1 (which is illustrated in FIG. 8B). In the present embodiment, the first axis A1, for example, extends along a vertical direction, but the extension direction of the first axis A1 is not limited thereto. In addition, in the present embodiment, the outer casing base 110 has a first bottom plate 111, two opposite first side plates 113 connected to the first bottom plate 111. The first bottom plate 111 and the two first side plates 113 jointly form a first space 112. Two first grooves 114 are provided on each of the first side plates 113, and the first grooves 114 on the two first side plates 113 are located at positions corresponding to each other. However, in other embodiments, the number and the disposition positions of the first grooves 114 are not limited thereto.

The inner casing base 120 is disposed on the outer casing base 110 movably along a second axis A2 (which is illustrated in FIG. 8B) and includes a second groove 124. A part of the second groove 124 extends along the second axis A2. In the present embodiment, an extension direction of the second axis A2 is vertical to that of the first axis A1, and the extension direction of the second axis A2 is illustrated as a horizontal direction for example, but the invention is not limited thereto. In addition, in the present embodiment, the inner casing base 120 has a second bottom plate 121, two opposite second side plates 123 connected to the second bottom plate 121. The second bottom plate 121 and the two second side plates 123 jointly form a second space 122. Two second grooves 124 are provided on each of the second side plates 123, and the second grooves 124 on the two second side plates 123 are located at positions corresponding to each other. However, in other embodiments, the number and the disposition positions of the second grooves 124 are not limited thereto. Furthermore, in the present embodiment, the number and the positions of the second grooves 124 correspond to those of the first grooves 114.

The bearing base 130 includes a protrusion pillar 132. The protrusion pillar 132 passes through one of the second grooves 124 and one of the first grooves 114. In the present embodiment, a plurality of protrusion pillars 132 are provided on two sides of the bearing base 130. The number and the positions of the protrusion pillars 132 correspond to those of the second grooves 124 and the first grooves 114 for the protrusion pillars 132 to pass through the second grooves 124 and the first grooves 114. In the present embodiment, the bearing base 130, in cooperation with the protrusion pillars 132, the first grooves 114 of the outer casing base 110 and the second grooves 124 of the inner casing base 120, may move relative to the outer casing base 110.

In addition, as illustrated in FIG. 6, in the present embodiment, a second fixing portion 144 of the cover body 140 is fixed to a first fixing portion 136 of the bearing base 130. The cover body 140 includes an opening 142. The expansion unit 135 is disposed on the bearing base 130. The expansion unit 135 is adapted to be disposed between the bearing base 130 and the cover body 140 and be exposed from the opening 142. In the present embodiment, the heat dissipating module 16 includes a heat-guiding plate 17, a heat pipe 18 disposed on the heat-guiding plate 17 and a heat dissipation pad 19 connected to the heat-guiding plate 17. The expansion unit 135 exposed from the opening 142 of the cover body 140, when being lifted by the bearing base 130, is adapted to contact the heat dissipation pad 19 of the heat dissipating module 16, such that the heat generated by the expansion unit 135 may be guided out through the heat dissipation pad 19, the heat-guiding plate 17 and the heat pipe 18.

Additionally, in the present embodiment, the lifting mechanism 100 further includes a first connector 118, a second connector 134 and a flexible circuit board 119. The first connector 118 is disposed on the outer casing base 110. The second connector 134 is disposed on the bearing base 130 and adapted to be connected to the expansion unit 135. In the present embodiment, the second connector 134 may be an M.2 interface connector. Namely, the expansion unit 135 may be an M.2 interface SSD, but the type of the second connector 134 is not limited thereto. The flexible circuit board 119 is located between the outer casing base 110 and the bearing base 130 and connected with the first connector 118 and the second connector 134. In the present embodiment, when the expansion unit 135 is inserted into the accommodation space 12 of the electronic device 10 together with the lifting mechanism 100, the expansion unit 135 is electrically connected to a frame base connector 15 in the electronic device 10 through the second connector 134, the flexible circuit board 119 and the first connector 118.

In the present embodiment, when the expansion unit 135 together with the lifting mechanism 100 is located at the position illustrated in FIG. 2, the bearing base 130 of the lifting mechanism 100 is located at an original position, and when the expansion unit 135 together with the lifting mechanism 100 is located at the position illustrated in FIG. 3, the bearing base 130 of the lifting mechanism 100 is located at a lifting position. How the lifting mechanism 100 operates during the process of the expansion unit 130 together with the lifting mechanism 100 moving from the position illustrated in FIG. 2 to the position illustrated in FIG. 3 will be described.

Figure 8A:
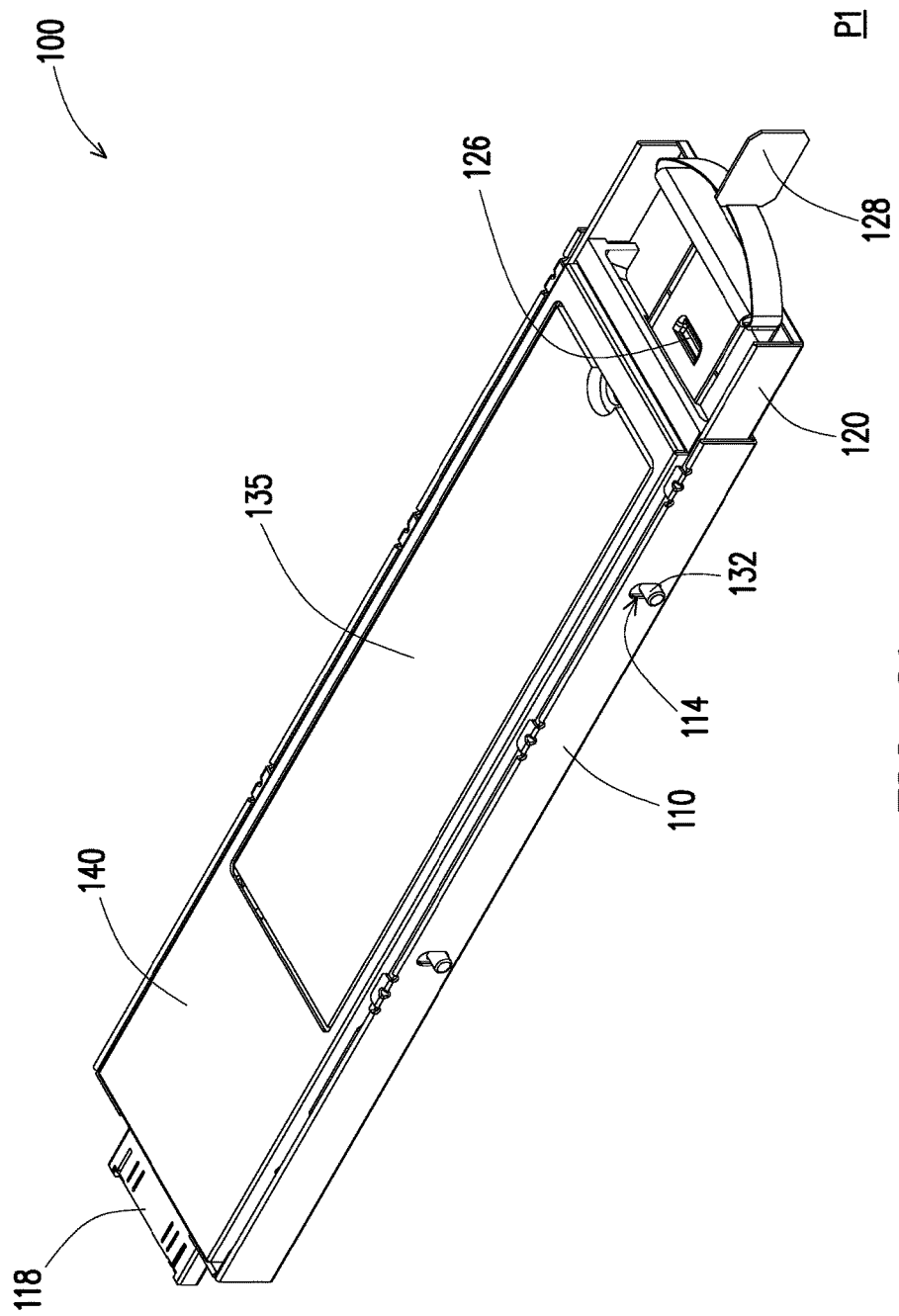
FIG. 8A to FIG. 8C are schematic diagrams illustrating that the bearing base of the lifting mechanism depicted in FIG. 1 is located at the original position respectively from a plurality of view angles.
Figure 8B:
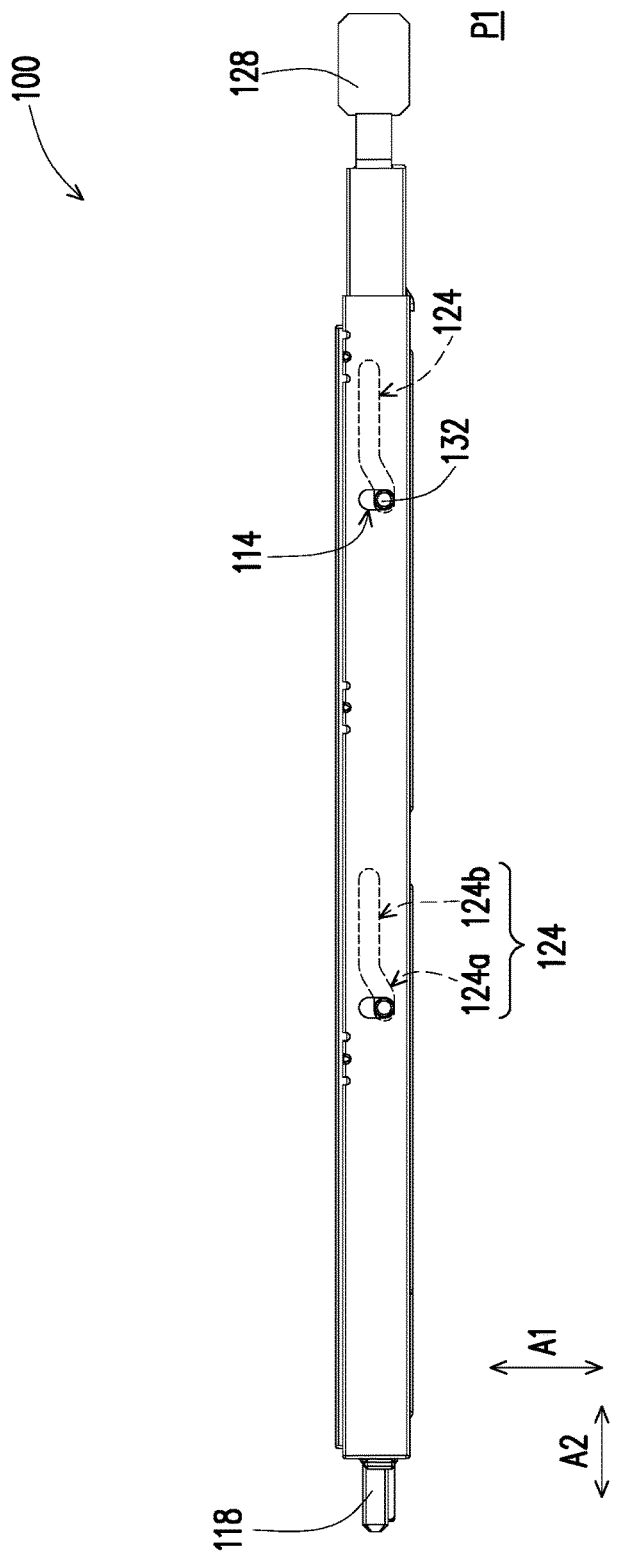
Figure 8C:
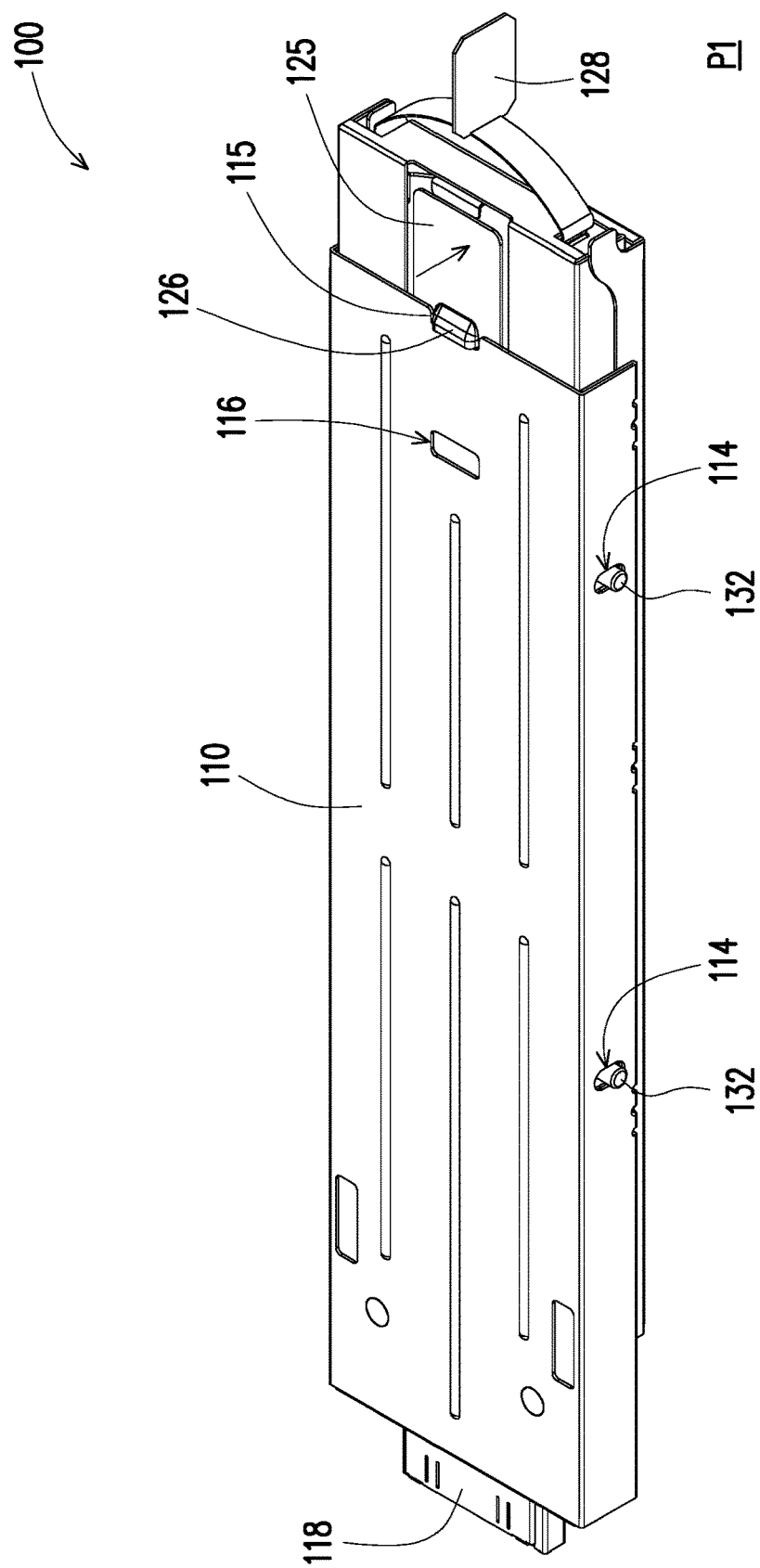
Figure 8D:
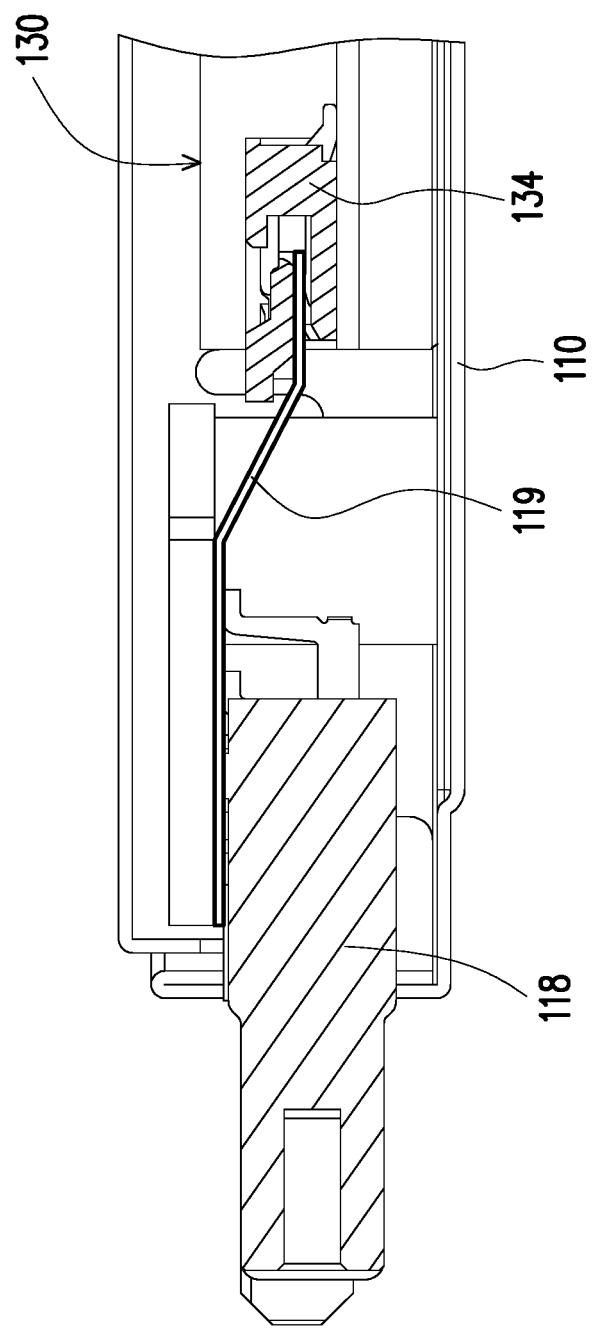
FIG. 8D is a partial schematic cross-sectional diagram illustrating that the bearing base of the lifting mechanism depicted in FIG. 1 is located at the original position.
Figure 9A:
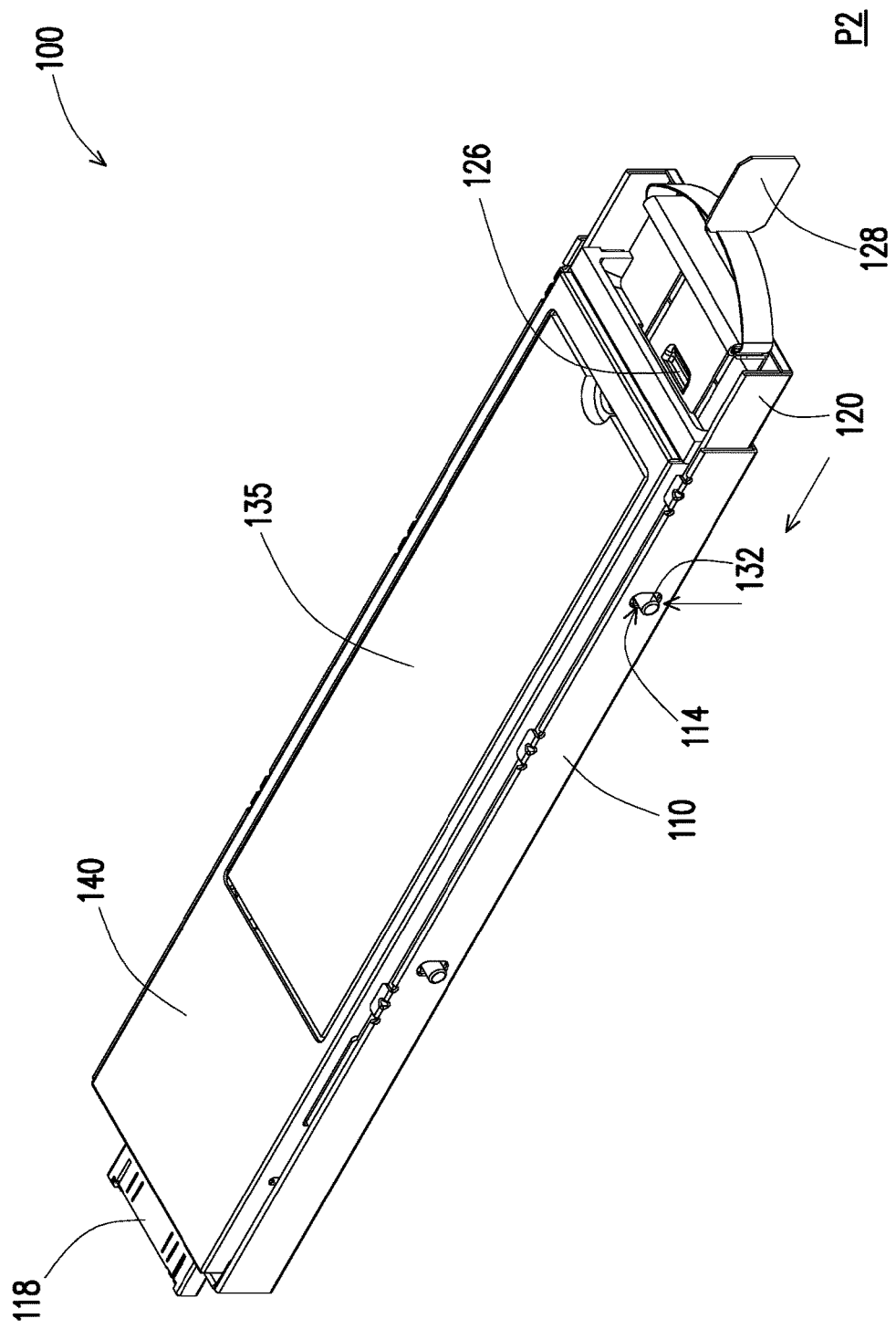
FIG. 9A to FIG. 9B are schematic diagrams illustrating that the bearing base of the lifting mechanism depicted in FIG. 1 is located at the center position respectively from a plurality of view angles.
Figure 9B:
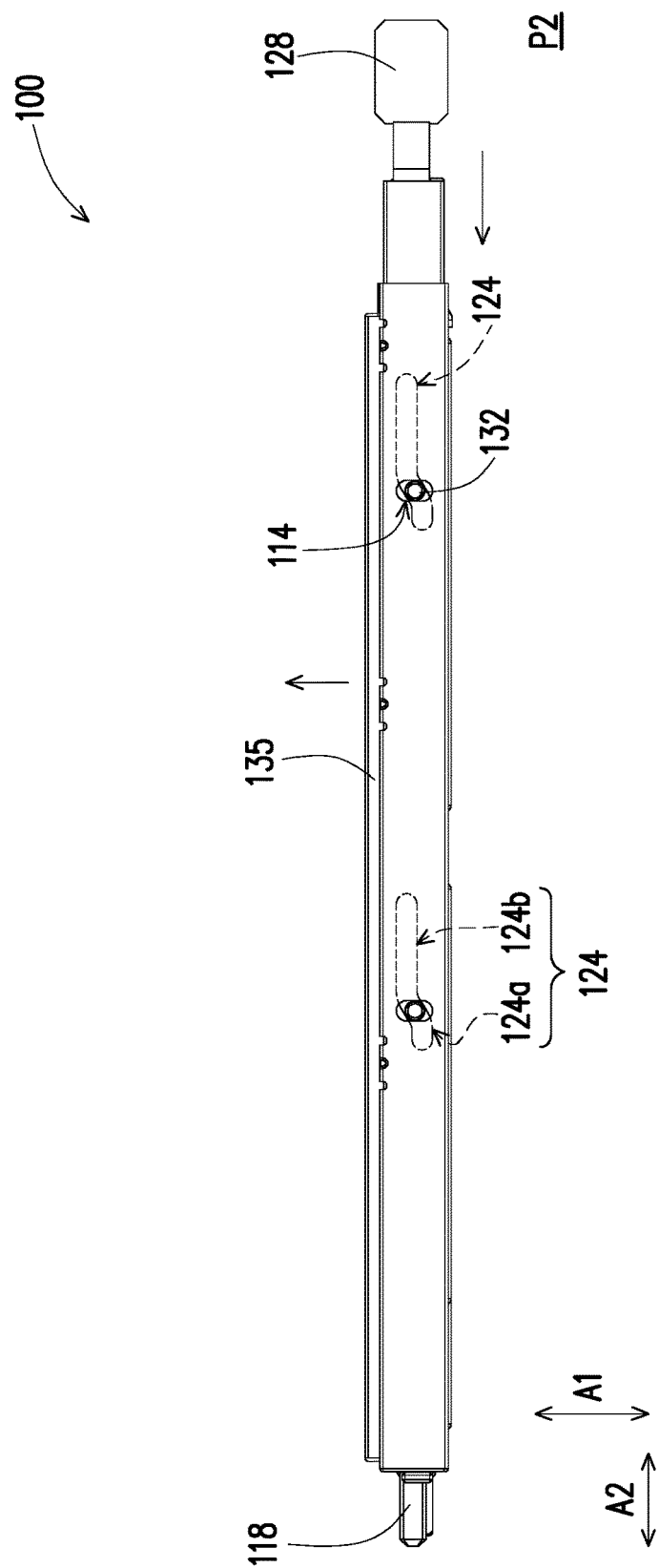
Figure 10A:
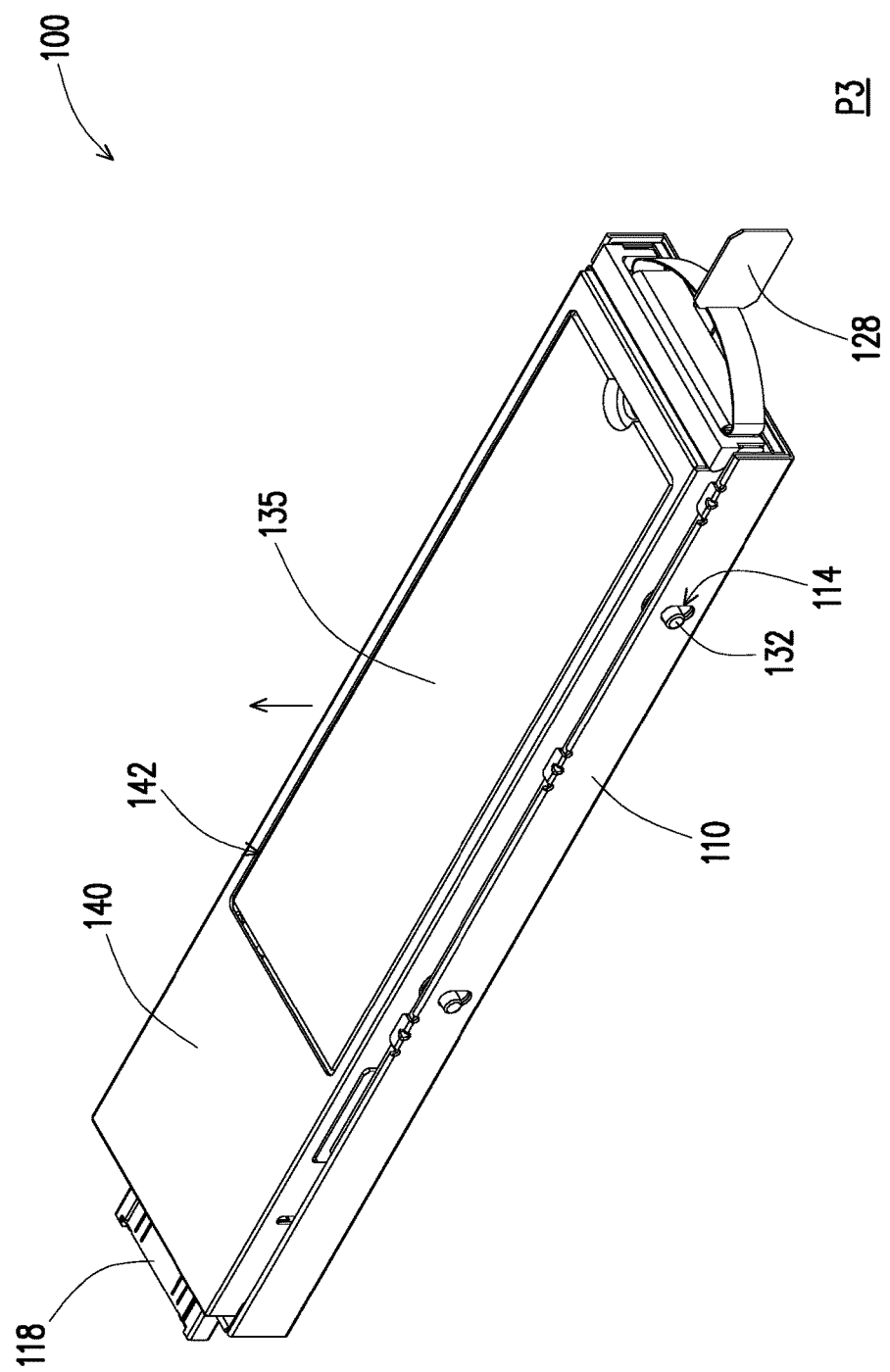
FIG. 10A to FIG. 10C are schematic diagrams illustrating that the bearing base of the lifting mechanism depicted in FIG. 1 is located at the lifting position respectively from a plurality of view angles.
Figure 10B:
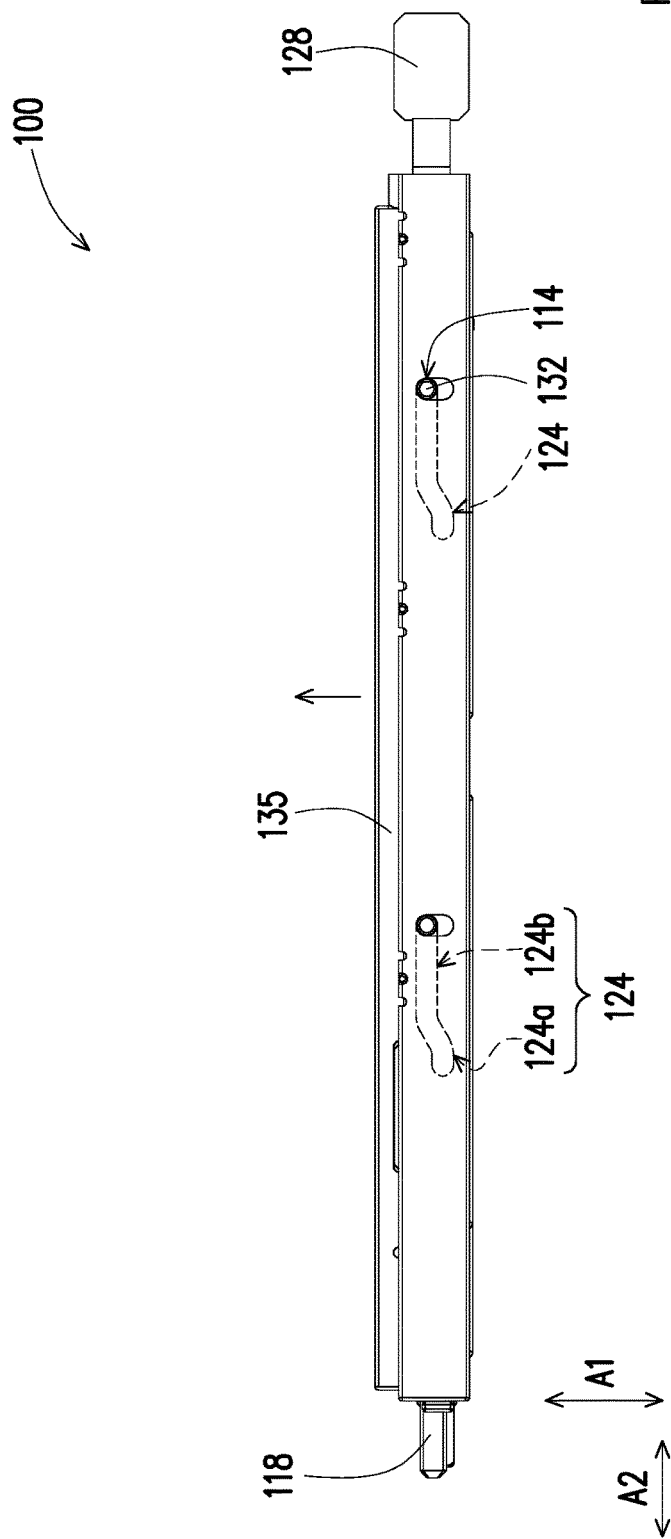
Figure 10C:
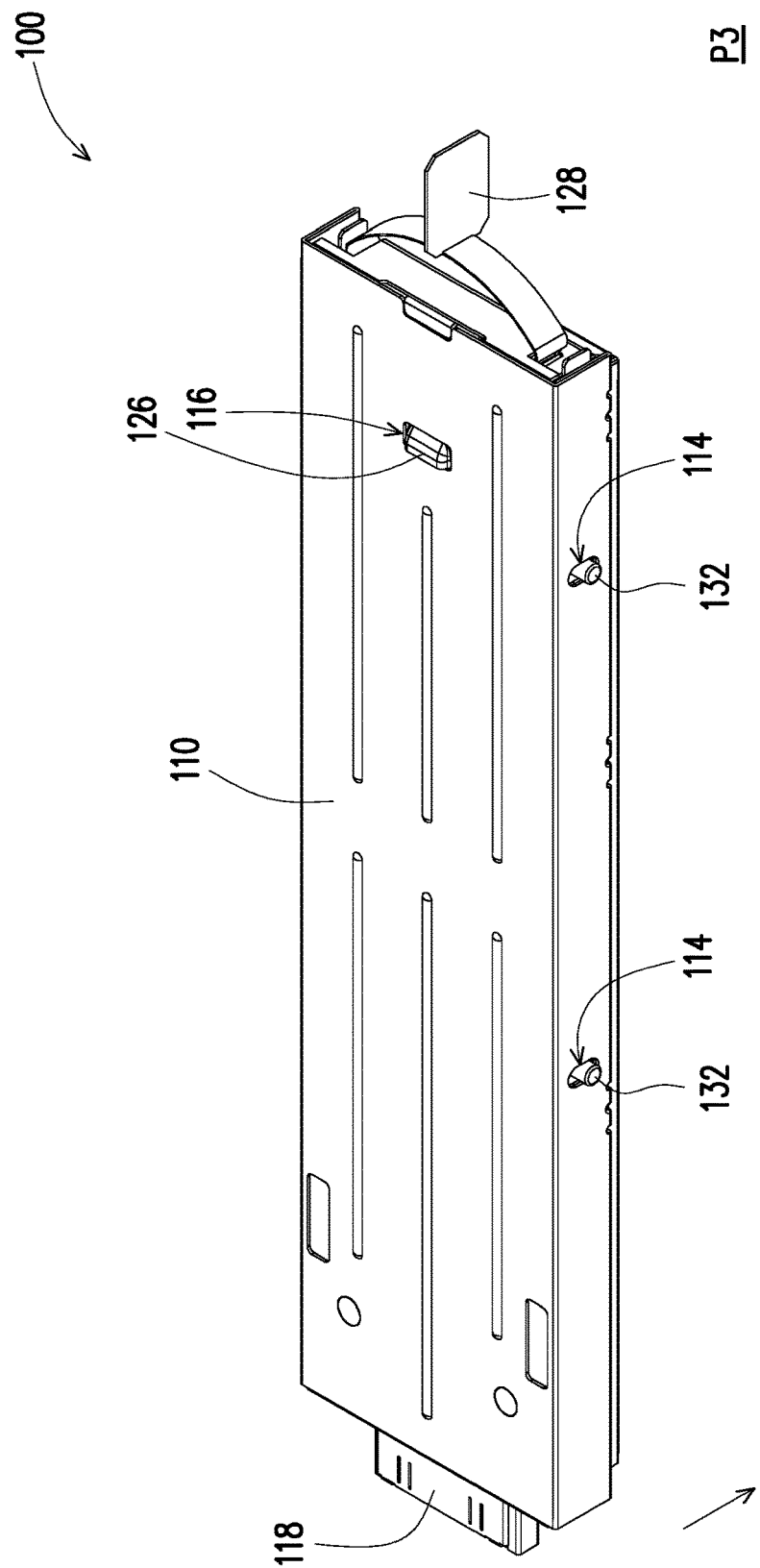
Figure 10D:
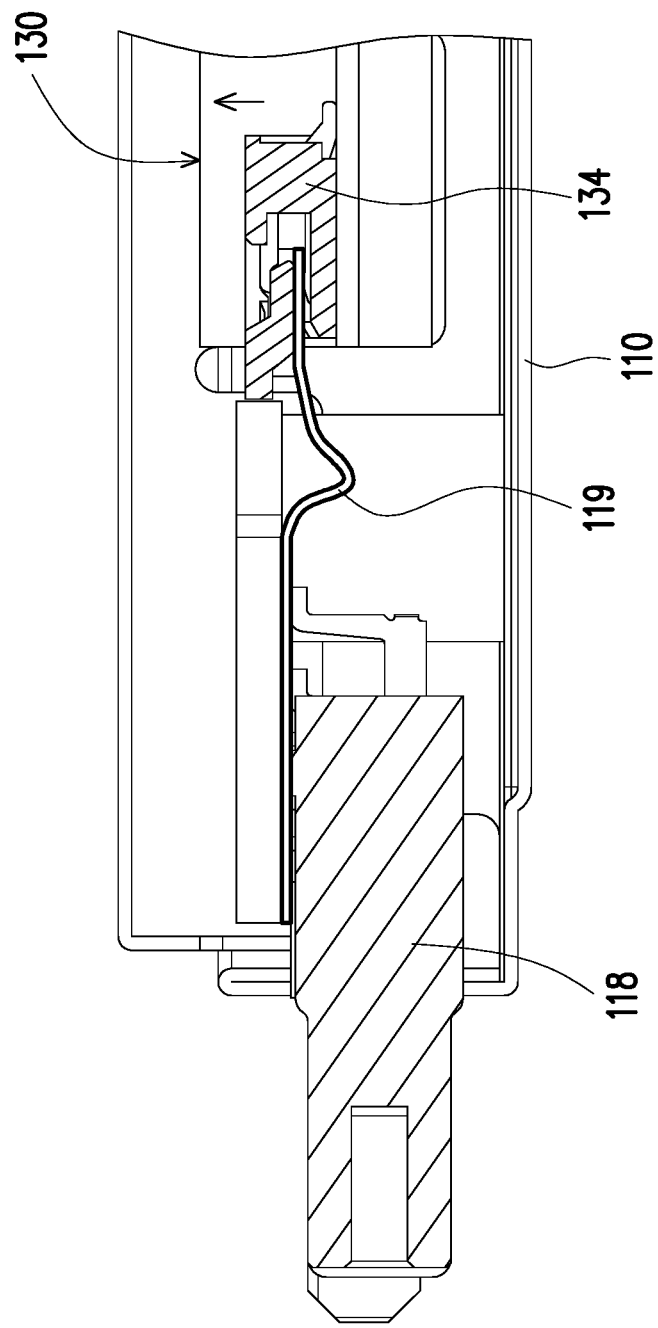
FIG. 10D is a partial schematic cross-sectional diagram illustrating that the bearing base of the lifting mechanism depicted in FIG. 1 is located at the lifting position.

FIG. 8A to FIG. 8C are schematic diagrams illustrating that the bearing base of the lifting mechanism depicted in FIG. 1 is located at the original position respectively from a plurality of view angles. FIG. 8D is a partial schematic cross-sectional diagram illustrating that the bearing base of the lifting mechanism depicted in FIG. 1 is located at the original position. FIG. 9A to FIG. 9B are schematic diagrams illustrating that the bearing base of the lifting mechanism depicted in FIG. 1 is located at the center position respectively from a plurality of view angles. FIG. 10A to FIG. 10C are schematic diagrams illustrating that the bearing base of the lifting mechanism depicted in FIG. 1 is located at the lifting position respectively from a plurality of view angles. FIG. 10 is a partial schematic cross-sectional diagram illustrating that the bearing base of the lifting mechanism depicted in FIG. 1 is located at the lifting position. It should be mentioned that FIG. 8A, FIG. 9A and FIG. 10A are respectively illustrated in the same top perspective view angle, and FIG. 8B, FIG. 9B and FIG. 10B are respectively illustrated in the same side perspective view angle. In order to clearly illustrate the relative position among the protrusion pillar 132, the first groove 114 and the second groove 124, the second groove 124 located in the internal is marked by dotted lines. FIG. 8C and FIG. 10C are respectively illustrated in the same bottom perspective view angle. FIG. 8D and FIG. 10D are illustrated in a cross-sectional view angle to show a part of the flexible circuit board 119.

Referring to FIG. 8A and FIG. 8B first, in the present embodiment, the second groove 124 includes a first section 124a (which is illustrated in FIG. 8B) and a second section 124b (which is illustrated in FIG. 8B) connected with each other. The second section 124b extends along the second axis A2, and the first section 124a is inclined with respect to the second section 124b. When the lifting mechanism 100 is located in the accommodation space 12 (which is illustrated in FIG. 2) and the bearing base 130 is located at an original position P1 relative to the outer casing base 110, the first section 124a of the second groove 124 overlaps a lower part of the first groove 114. Namely, the protrusion pillar 132 is located in the lower part of the first groove 114 of the outer casing base 110 and the leftmost side of the first section 124a of the second groove 124. In this circumstance, the expansion unit 135 on the bearing base 130 is not yet lifted and separated from the heat dissipating module 16 (which is illustrated in FIG. 5).

Then, if the inner casing base 120 is pushed along the second axis A2, the bearing base 130 correspondingly moves along the first axis A1. Referring to FIG. 9A and FIG. 9B, in the present embodiment, when the bearing base 130 is located at a center position P2 relative to the outer casing base 110, the protrusion pillar 132 is located in the center of the first groove 114 of the outer casing base 110 and between the first section 124a and the second section 124b of the second groove 124. In this circumstance, the expansion unit 135 on the bearing base 130 is slightly lifted.

Thereafter, as illustrated in FIG. 10A and FIG. 10B, when the bearing base 130 is located at a lifting position P3 relative to the outer casing base 110, the protrusion pillar 132 is located in a upper part of the first groove 114 of the outer casing base 110 and the right side of the second section 124b of the second groove 124. In this circumstance, the expansion unit 135 on the bearing base 130 is lifted to contact the heat dissipating module 16. According to FIG. 8A to FIG. 10B, in the present embodiment, the bearing base 130 is disposed on the outer casing base 110 liftably along the first axis A1, the bearing base 120 is disposed on the outer casing base 110 movably along the second axis A2.

It is to be mentioned that if the expansion unit 135 needs a heat dissipation affect in the accommodation space 12 in the scenario that the expansion unit 135 together with the lifting mechanism 100 is located in the accommodation space 12 between a frame (which should be the frame base 14) and the heat dissipating module 16, the expansion unit 135 has to face the heat dissipating module 16. In other words, the outer casing base 110 of the lifting mechanism 110 has to face the frame. In the present embodiment, for the purpose of preventing the user from inserting the expansion unit 135 together with the lifting mechanism 100 in the accommodation space 12 in a vertically opposite direction, failing to dissipate the heat for the expansion unit 135 and preventing the expansion unit 135 from being incorrectly electrically connected to the electron device 10, returning to FIG. 6, the frame base 14 includes a side wall 14a and a foolproof groove 14b sunk in the side wall 14a in the present embodiment. The foolproof groove 14b extends along the second axis A2 and communicates with the accommodation space 12. A height position of the foolproof groove 14b on the side wall 14a corresponds to a height of the protrusion pillar 132 when the bearing base 130 of the lifting mechanism 100 is at the original position P1.

Thus, when the expansion unit 135 together with the lifting mechanism 100 is inserted into the accommodation space 12 in a correct direction (i.e., when the expansion unit 135 together with the lifting mechanism 100 is located in the accommodation space 12 between the frame and the heat dissipating module 16, the expansion unit 135 faces the heat dissipating module 16, and the outer casing base 110 faces the frame base 14), the protrusion pillar 132 may slide to a positioning groove 14c along the foolproof groove 14b. When the expansion unit 135 together with the lifting mechanism 100 is inserted into the accommodation space 12 in an incorrect direction (i.e., the expansion unit 135 faces the frame base 14, and the outer casing base 110 faces the heat dissipating module 16), the protrusion pillar 132 of the bearing base 130 is stopped by the side wall 14a of the frame base 14, such that the expansion unit 135 and the lifting mechanism 100 is stopped from entering into the accommodation space 12.

Additionally, in the present embodiment, as illustrated in FIG. 6, the first bottom plate 111 of the outer casing base 110 includes a first positioning portion 115 and a second positioning portion 116 arranged along the second axis A2. The second bottom plate 121 of the inner casing base 120 includes a cantilever 125 and a third positioning portion 126 protruding from the cantilever 125. As illustrated in FIG. 8C, when the bearing base 130 is located at the original position P1, the third positioning portion 126 is fixed to the first positioning portion 115, and as illustrated in FIG. 2, the third positioning portion 126 is interfered by the electron device 10. In this circumstance, the third positioning portion 126 of the inner casing base 120 may be retracted into the outer casing base 110 as the user slightly turns the cantilever 125, thereby releasing the interference between the third positioning portion 126 of the inner casing base 120 and the electron device 10, and then, the inner casing base 120 is moved relative to the outer casing base 110 along the second axis A2 (as illustrated in FIG. 9B), so as to be assembled to a specified position as illustrated in FIG. 3.

Accordingly, in the present embodiment, the expansion unit 100 is inserted into the accommodation space 12 is two stages. As illustrated in FIG. 1 to FIG. 2, in the first stage, most of the lifting mechanism 100 and the expansion unit 135 are together inserted into the accommodation space 12, and the first connector 118 of the lifting mechanism 100 is inserted into the frame base connector 15 of the frame base 14. Thereafter, the cantilever 125 is turned to release the engagement between the third positioning portion 126 of the inner casing base 120 and the first positioning portion 115 of the outer casing base 110, thereby, continuously pushing the inner casing base 120 along the second axis A2 to enter to the second stage as illustrated from FIG. 2 to FIG. 3. During the process of the second stage, the expansion unit 135 and the lifting mechanism 100 moves toward the heat dissipating module 16, and finally, the expansion unit 135 contacts the heat dissipating module 16.

In addition, in the present embodiment, as illustrated in FIG. 10C, the inner casing base 120 further includes a pull handle 128 exposed from the outer casing base 110, and a part of the third positioning portion 126 which faces the pull handle 128 includes a bevel or an arc surface. When the bearing base 130 is located at the lifting position P3, the third positioning portion 126 is fixed to the second positioning portion 116. The user, if desiring to move the lifting mechanism 100 out of the accommodation space 12, only has to pull the pull handle 128 of the inner casing base 120, thereby pulling the inner casing base 120 out of the outer casing base 110, such that the bevel of the third positioning portion 126 moves along an edge of the second positioning portion 116 to leave the second positioning portion 116 and moves to the first positioning portion 115. During this process, the expansion unit 135 moves in a direction departing away from the heat dissipating module 16 and returns to the position illustrated in FIG. 1 from the position illustrated in FIG. 2. Namely, the lifting mechanism 100 is pulled out of the accommodation space 12 in one stage and automatically returns to a state ready for being inserted next time after the accommodation space 12 is pulled out, which is quite convenient in use.

Additionally, as illustrated in FIG. 8D and FIG. 10D, in the present embodiment, as the first connector 118 is connected to the second connector 134 with the flexible circuit board 119, the expansion unit 135 may still keep being electrically connected with the first connector 118 of the outer casing base 110 during the process of the bearing base 130 being lifted from the original position P1 to the lifting position P3 even though the relative location between the bearing base 130 and the outer casing base 110 changes.

It should be mentioned that the embodiments above, the bearing base 130 of the lifting mechanism 100, in cooperation with the protrusion pillars 132, the first grooves 124 of the outer casing base 120 and the second grooves 114 of the inner casing base 110, may achieve the operation of lifting the bearing base 130 from the original position P1 to the lifting position P3; however, in other embodiments, the aforementioned function between the bearing base 130 and the outer casing base 110 may also be achieved by means of the disposition of parallel linking rods, cross-linking rods, springs, torsion springs, a gear and rack set and so on, but the structure of the lifting mechanism 100 is not limited to the above.

Based on the above, the lifting mechanism of the electronic device of the invention, with the bearing base, can be lifted relative to the outer casing base along the first axis. When the lifting mechanism is located in the accommodation space and the bearing base is located at an original position relative to the outer casing base, the expansion unit on the bearing base does not contact the heat dissipating module. When the bearing base is lifted relative to the outer casing base along the first axis to a lifting position, the expansion unit on the bearing base contacts the heat dissipating module. Thereby, the lifting mechanism, during the process of entering the accommodation space of the electronic device, can be prevented from interfering with the heat dissipating module.

Although the invention has been disclosed by the above embodiments, they are not intended to limit the invention. It will be apparent to one of ordinary skill in the art that modifications and variations to the invention may be made without departing from the spirit and scope of the invention. Therefore, the scope of the invention will be defined by the appended claims.

What is claimed is:

1. A lifting mechanism, adapted to bear an expansion unit for the expansion unit to contact or be separated from a heat dissipating module, the lifting mechanism comprising:
    an outer casing base;
    a bearing base, disposed on the outer casing base liftably along a first axis and adapted to bear the expansion unit,
    a first connector, disposed on the outer casing base;
    a second connector, disposed on the bearing base and adapted to be connected to the expansion unit; and
    a flexible circuit board, located between the outer casing base and the bearing base and connected to the first connector and the second connector,
    wherein when the bearing base is located at an original position relative to the outer casing base, the expansion unit on the bearing base is separated from the heat dissipating module, and when the bearing base is lifted relative to the outer casing base along the first axis to a lifting position, the expansion unit on the bearing base contacts the heat dissipating module.

2. The lifting mechanism according to claim 1, wherein the outer casing base comprises a first groove extending along the first axis, and the lifting mechanism further comprises:
    an inner casing base, disposed on the outer casing base movably along a second axis and comprising a second groove, wherein a part of the second groove extend along the second axis, the bearing base comprises a protrusion pillar passing the second groove and the first groove,
    wherein the inner casing base is adapted to move relative to the outer casing base along the second axis, such that the bearing base is lifted relative to the outer casing base from the original position to the lifting position along the first axis.

3. The lifting mechanism according to claim 2, wherein the second groove comprises a first section and a second section connected with each other, the second section extends along the second axis, and the first section is inclined with respect to the second section.

4. The lifting mechanism according to claim 2, wherein the outer casing base comprises a first bottom plate, the first bottom plate comprises a first positioning portion and a second positioning portion arranged along the second axis, the inner casing base comprises a second bottom plate, the second bottom plate comprises a cantilever and a third positioning portion protruding from the cantilever, the third positioning portion is fixed to the first positioning portion when the bearing base is located at the original position, and the third positioning portion is fixed to the second positioning portion when the bearing base is located at the lifting position.

5. The lifting mechanism according to claim 4, wherein the inner casing base further comprises a pull handle exposed from the outer casing base, and a part of the third positioning portion which faces the pull handle comprises a bevel or an arc surface.

6. The lifting mechanism according to claim 1, further comprising:
    a cover body, fixed to the bearing base and comprising an opening, and the expansion unit being adapted to be disposed between the bearing base and the cover body and exposed from the opening.

7. An electronic device, comprising:
    a frame base;
    a heat dissipating module, fixed to the frame base, thereby jointly forming an accommodation space;
    a lifting mechanism, pluggably disposed in the accommodation space and comprising:
    an outer casing base; and
    a bearing base, disposed on the outer casing base liftably along a first axis; and
    an expansion unit, disposed on the bearing base, wherein when the lifting mechanism is located in the accommodation space and the bearing base is located at an original position relative to the outer casing base, the expansion unit on the bearing base is separated from the heat dissipating module, and when the bearing base is lifted relative to the outer casing base along the first axis to a lifting position, the expansion unit on the bearing base contacts the heat dissipating module.

8. The electronic device according to claim 7, wherein the outer casing base comprises a first groove extending along the first axis, and the lifting mechanism further comprises:
    an inner casing base, disposed on the outer casing base movably along a second axis and comprising a second groove, a part of the second groove extending along the second axis, and the bearing base comprising a protrusion pillar, wherein the protrusion pillar passes the second groove and the first groove, and the inner casing base is adapted to move relative to the outer casing base along the second axis, such that the bearing base is lifted relative to the outer casing base from the original position to the lifting position along the first axis.

9. The electronic device according to claim 8, wherein the frame base comprises a side wall and a foolproof groove sunk in the side wall, the foolproof groove extends along the second axis and communicates with the accommodation space, and when the lifting mechanism is located in the accommodation space and the outer casing base faces the frame base, the protrusion pillar of the bearing base extends into the foolproof groove.

10. The electronic device according to claim 8, wherein the second groove comprises a first section and a second section connected with each other, the second section extends along the second axis, and the first section is inclined with respect to the second section.

11. The electronic device according to claim 8, wherein the outer casing base comprises a first bottom plate, the first bottom plate comprises a first positioning portion and a second positioning portion arranged along the second axis, the inner casing base comprises a second bottom plate, the second bottom plate comprises a cantilever and a third positioning portion protruding from the cantilever, when the bearing base is located at the original position, the third positioning portion is fixed to the first positioning portion, and when the bearing base is located at the lifting position, the third positioning portion is fixed to the second positioning portion.

12. The electronic device according to claim 11, wherein the inner casing base further comprises a pull handle exposed from the outer casing base, and a part of the third positioning portion which faces the pull handle comprises a bevel or an arc surface.

13. The electronic device according to claim 7, wherein the lifting mechanism further comprises:
a cover body, fixed to the bearing base and comprising an opening, wherein the expansion unit is adapted to be disposed between the bearing base and the cover body and be exposed from the opening.

14. The electronic device according to claim 7, wherein the lifting mechanism further comprises:
a first connector, disposed on the outer casing base;
a second connector, disposed on the bearing base and adapted to be connected to the expansion unit; and
a flexible circuit board, located between the outer casing base and the bearing base and connected to the first connector and the second connector.

15. The electronic device according to claim 7, wherein the electronic device further comprises a chassis, the frame base and the heat dissipating module are disposed in the chassis, the chassis comprises an opening exposing the accommodation space, and the lifting mechanism and the expansion unit passing through the opening of the chassis are pluggably disposed in the accommodation space.

* * * * *